US012727145B2

(12) United States Patent
Lee et al.

(10) Patent No.: US 12,727,145 B2
(45) Date of Patent: Sep. 1, 2026

(54) SEMICONDUCTOR MEMORY DEVICES

(71) Applicant: Samsung Electronics Co., Ltd., Suwon-si (KR)

(72) Inventors: Kiseok Lee, Hwaseong-si (KR); Hyungeun Choi, Suwon-si (KR); Gijae Kang, Hwaseong-si (KR); Keunnam Kim, Yongin-si (KR); Soobin Yim, Hwaseong-si (KR); Moonyoung Jeong, Suwon-si (KR); Seungjae Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 851 days.

(21) Appl. No.: 18/050,497

(22) Filed: Oct. 28, 2022

(65) Prior Publication Data

US 2023/0178505 A1 Jun. 8, 2023

(30) Foreign Application Priority Data

Dec. 7, 2021 (KR) ........................ 10-2021-0174224

(51) Int. Cl.

*H10B 12/00* (2023.01)
*H10W 80/00* (2026.01)
*H10W 90/00* (2026.01)

(52) U.S. Cl.

CPC ............. *H10B 12/30* (2023.02); *H10B 12/50* (2023.02); *H10W 90/00* (2026.01); (Continued)

(58) Field of Classification Search

CPC ..... H01L 24/08; H01L 24/80; H01L 25/0657; H01L 25/18; H01L 2224/08145; (Continued)

(56) References Cited

U.S. PATENT DOCUMENTS 8,501,617 B2 8/2013 Park et al.
8,836,075 B2 9/2014 Suguro
(Continued)

FOREIGN PATENT DOCUMENTS

CN 214505493 U 10/2021
KR 10-2019-0053715 A 5/2019
(Continued)

*Primary Examiner* — Thanh Y. Tran
(74) *Attorney, Agent, or Firm* — Wolf, Greenfield & Sacks, P.C.

(57) ABSTRACT

Semiconductor memory devices may include a cell array structure that may include a memory cell array including three-dimensionally arranged memory cells and first bonding pads connected to the memory cell array and a peripheral circuit structure that may include peripheral circuits and second bonding pads bonded to the first bonding pads. The cell array structure may include a lower dielectric layer having a first surface and a second surface opposite to the first surface, a stack structure including horizontal electrodes stacked in a vertical direction on the first surface of the lower dielectric layer, a vertical structure including vertical conductive patterns that extend in the vertical direction and cross the horizontal electrodes, and an input/output pad on the second surface of the lower dielectric layer.

20 Claims, 14 Drawing Sheets

(52) U.S. Cl.
CPC ........ *H10W 80/211* (2026.01); *H10W 80/312* (2026.01); *H10W 80/327* (2026.01); *H10W 90/792* (2026.01)

(58) Field of Classification Search
CPC ... H01L 2224/80895; H01L 2924/1431; H01L 2924/1436; H01L 24/24; H10B 12/30; H10B 12/50; H10B 12/312; H10B 12/315
See application file for complete search history.

(56) References Cited

U.S. PATENT DOCUMENTS

| | | | | |
|---|---|---|---|---|
| 10,607,995 | B2 | 3/2020 | Roberts et al. | |
| 10,672,789 | B2 | 6/2020 | Song et al. | |
| 10,861,854 | B2 | 12/2020 | Kim et al. | |
| 10,892,337 | B2 | 1/2021 | Glass et al. | |
| 10,991,675 | B2 | 4/2021 | Or-Bach et al. | |
| 11,233,042 | B2 | 1/2022 | Kim et al. | |
| 11,410,951 | B2 | 8/2022 | Choi et al. | |
| 11,456,290 | B2 | 9/2022 | Zhang et al. | |
| 11,501,827 | B2 | 11/2022 | Kim et al. | |
| 2018/0337054 | A1 | 11/2018 | Sung et al. | |
| 2020/0144242 | A1 | 5/2020 | Park | |
| 2020/0176420 | A1 | 6/2020 | Or-Bach et al. | |
| 2020/0357784 | A1 | 11/2020 | Park | |
| 2021/0057325 | A1 | 2/2021 | Chou et al. | |
| 2021/0057419 | A1 | 2/2021 | Shin et al. | |
| 2021/0074716 | A1 | 3/2021 | Lim et al. | |
| 2021/0143154 | A1 | 5/2021 | Lee et al. | |
| 2021/0327838 | A1 | 10/2021 | Hou et al. | |
| 2021/0375790 | A1 | 12/2021 | Oda et al. | |
| 2022/0068859 | A1* | 3/2022 | Choi | H10B 12/05 |
| 2023/0180468 | A1* | 6/2023 | Lee | H01L 24/06 |

FOREIGN PATENT DOCUMENTS

| | | | |
|---|---|---|---|
| KR | 10-2019-0131592 | A | 11/2019 |
| KR | 10-2021-0022234 | A | 3/2021 |
| KR | 10-2021-0027696 | A | 3/2021 |
| KR | 10-2021-0137123 | A | 11/2021 |
| TW | 202034501 | A | 9/2020 |

* cited by examiner

FIG. 10

120
110
PC
IOPLG
CPLG
CPLG
CPLG
CPLG
BL
BL
TL
WL
ILD
WL
...
ILD
WL
ILD
10
20
10
SRB
100
PR1
WCR
CAR
BCR

FIG. 11

100
SRB
10
20
10
20
ILD
WL
ILD
WL
ILD
WL
ILD
BL
BP1a
BP2a
PLP
PS
CAR
BCR
WCR
PR1
CR1
CR2
PR2
SA
SWD
PTR
PC
IOPLG
110
120
130
140
150
160
BP1c
BP2c
220
210
200

SEMICONDUCTOR MEMORY DEVICES

CROSS-REFERENCE TO RELATED APPLICATION

This U.S. nonprovisional application claims priority under 35 U.S.C § 119 to Korean Patent Application No. 10-2021-0174224 filed on Dec. 7, 2021 in the Korean Intellectual Property Office, the disclosure of which is hereby incorporated by reference in its entirety.

BACKGROUND

The present inventive concepts relate to a semiconductor memory device, and more particularly, to a three-dimensional semiconductor memory device having improved reliability and integration density.

Semiconductor devices have been highly integrated for high performance and low manufacturing cost. Because the integration density of semiconductor devices may be one of various factors affecting product price, the high integration density is considered beneficial. The integration density of two-dimensional or planar semiconductor devices may be primarily determined by the area occupied by a unit memory cell, such that it may be greatly influenced by the level of technology for forming fine patterns. However, extremely expensive processing equipment may be used to increase pattern fineness and thus increasing the integration density of two-dimensional or planar semiconductor devices has been limited. Therefore, three-dimensional semiconductor memory devices including three-dimensionally arranged memory cells have been proposed.

SUMMARY

Some embodiments of the present inventive concepts provide three-dimensional semiconductor memory devices with improved reliability and increased integration density.

The object of the present inventive concepts is not limited to the mentioned above, and other objects which have not been mentioned above will be clearly understood to those skilled in the art from the following description.

According to some embodiments of the present inventive concepts, semiconductor memory devices may include a cell array structure including a memory cell array and a plurality of first bonding pads connected to (e.g., electrically connected to) the memory cell array, the memory cell array including a plurality of memory cells that are three-dimensionally arranged; and a peripheral circuit structure including a plurality of peripheral circuits and a plurality of second bonding pads bonded to the first bonding pads. The cell array structure may include: a lower dielectric layer having a first surface and a second surface opposite to the first surface; a stack structure including a plurality of horizontal electrodes that are stacked in a vertical direction on the first surface of the lower dielectric layer; a vertical structure including a plurality of vertical conductive patterns (e.g., a plurality of vertical conductive lines) that extend in the vertical direction and cross the horizontal electrodes; and an input/output pad on the second surface of the lower dielectric layer.

According to some embodiments of the present inventive concepts, semiconductor memory devices may include a cell array structure including a plurality of memory cells and a plurality of first bonding pads connected to (e.g., electrically connected to) the memory cells, the cell array structure including a cell array region on which the memory cells are provided and a first peripheral region around the cell array region; a peripheral circuit structure including a plurality of peripheral circuits and a plurality of second bonding pads connected to (e.g., electrically connected to) the peripheral circuits, the second bonding pads being bonded to the first bonding pads; and a passivation layer including a plurality of input/output pads and a plurality of dummy pads. When viewed in cross section, the cell array structure may be between the passivation layer and the peripheral circuit structure. The input/output pads may overlap the first peripheral region of the cell array structure. The dummy pads may overlap the cell array region of the cell array structure.

According to some embodiments of the present inventive concepts, semiconductor memory devices may include a cell array structure including a plurality of first bonding pads connected to (e.g., electrically connected to) a plurality of memory cells, the cell array structure having a cell array region on which the memory cells are provided and a first peripheral region adjacent the cell array region, the cell array region having a bit-line connection region and a word-line connection region; and a peripheral circuit structure including a plurality of second bonding pads that are connected to (e.g., electrically connected to) peripheral circuits and are bonded to the first bonding pads. The cell array structure may include: a lower dielectric layer having a first surface and a second surface that are opposite to each other; a stack structure including a plurality of word lines that are stacked in a direction perpendicular to the first surface of the lower dielectric layer; a vertical structure including a plurality of bit lines that may be in (e.g., may penetrate) the stack structure; an input/output plug that may be in (e.g., may penetrate) a planarized dielectric layer and may be on (e.g., may cover) the stack structure; an input/output pad on the second surface of the lower dielectric layer on the first peripheral region, the input/output pad being connected to (e.g., electrically connected to) the input/output plug; and a plurality of dummy pads on the second surface of the lower dielectric layer on the bit-line connection region and the word-line connection region.

Details of other embodiments are included in the description and drawings.

BRIEF DESCRIPTION OF THE DRAWINGS

FIGS. 9 to 14 illustrate cross-sectional views showing a method of fabricating a semiconductor memory device according to some embodiments of the present inventive concepts.

DETAILED DESCRIPTION

With reference to drawings, the following will discuss in detail a semiconductor memory device according to some embodiments of the present inventive concepts.

Figure 1:
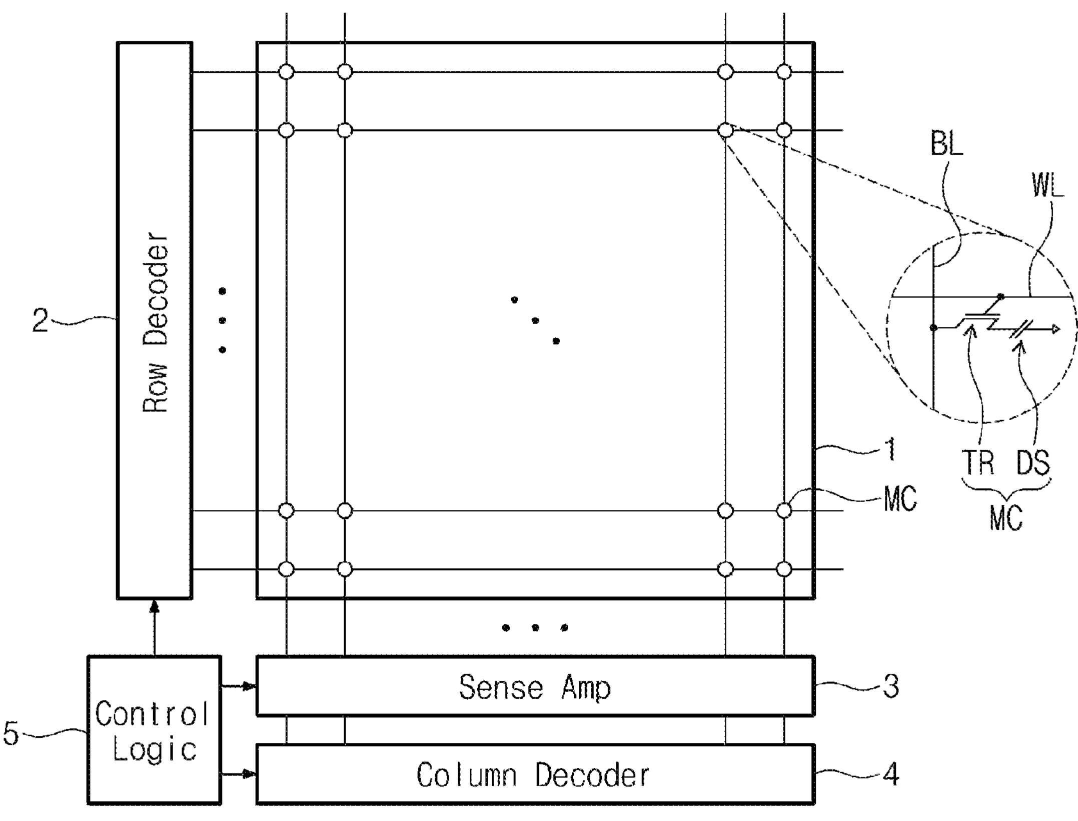
FIG. 1 illustrates a block diagram showing a semiconductor memory device according to some embodiments of the present inventive concepts.

FIG. 1 illustrates a block diagram showing a semiconductor memory device according to some embodiments of the present inventive concepts.

Referring to FIG. 1, a semiconductor memory device may include a memory cell array 1, a row decoder 2, a sense amplifier 3, a column decoder 4, and a control logic 5.

The memory cell array 1 may include a plurality of memory cells MC that are arranged three-dimensionally. Each of the memory cells MC may be connected between a word line WL and a bit line BL that intersect each other.

Each of the memory cells MC may include a selection element TR and a data storage element DS, which elements TR and DS may be electrically connected in series to each other. The selection element TR may be, for example, a field effect transistor (FET), and the data storage element DS may be, for example, a capacitor or a variable resistor. For example, the selection element TR may include a transistor, which transistor may include a gate electrode connected to the word line WL, a drain terminal connected to the bit line BL, and a source terminal connected to the data storage element DS.

The row decoder 2 may decode an address that is externally input, and may select one of the word lines WL of the memory cell array 1. The address that is decoded in the row decoder 2 may be provided to a row driver (not shown), and in response to a control operation of control circuits, the row driver may provide a certain voltage to a selected word line WL and each of non-selected word lines WL.

In response to an address that is decoded from the column decoder 4, the sense amplifier 3 may detect and amplify a voltage difference between a selected bit line BL and a reference bit line, and may then output the amplified voltage difference.

The column decoder 4 may provide a data delivery path between the sense amplifier 3 and an external device (e.g., a memory controller). The column decoder 4 may decode an address that is externally input and may select one of the bit lines BL.

The control logic 5 may generate control signals that control operations to write data to the memory cell array 1 and/or to read data from the memory cell array 1.

Figure 2:
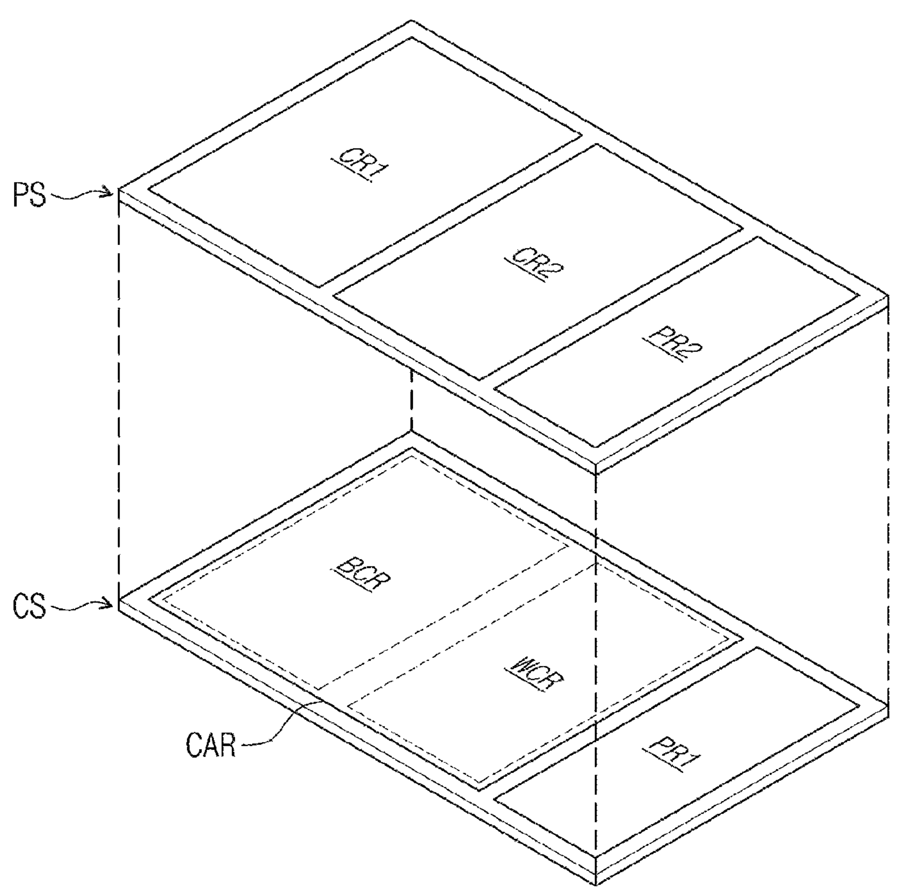
FIG. 2 illustrates a simplified perspective view showing a semiconductor memory device according to some embodiments of the present inventive concepts.

FIG. 2 illustrates a simplified perspective view showing a semiconductor memory device according to some embodiments of the present inventive concepts.

Referring to FIG. 2, a semiconductor memory device may include a cell array structure CS and a peripheral circuit structure PS.

The cell array structure CS may include a memory cell array region CAR and a first peripheral region PR1. The memory cell array region CAR may include a bit-line connection region BCR and a word-line connection region WCR.

A memory cell array (see the memory cell array 1 of FIG. 1) may be provided on the memory cell array region CAR. As discussed with reference to FIG. 1, the memory cell array may include word lines, bit lines that intersect the word lines, and memory cells provided between the word lines and the bit lines. The memory cells of the memory cell array may be arranged three-dimensionally. The bit lines may be provided on the bit-line connection region BCR, and the word lines may be provided on the bit-line connection region BCR and the word-line connection region WCR.

The peripheral circuit structure PS may include a first core region CR1, a second core region CR2, and a second peripheral region PR2. The first and second core regions CR1 and CR2 may vertically overlap the memory cell array region CAR. The second peripheral region PR2 may vertically overlap the first peripheral region PR1. As used herein, "an element A vertically overlapping an element B" (or similar language) means that at least one vertical line intersecting both the elements A and B exists.

The first core region CR1 may include a plurality of sense amplifiers, and the second core region CR2 may include a plurality of sub-word line drivers.

The first and second peripheral regions PR1 and PR2 may include a control signal generation circuit that controls the sub-word line driver, and may also include a control signal generation circuit that controls a sense amplifier. In addition, the first and second peripheral regions PR1 and PR2 may include a voltage generator that provides an operating voltage to the sense amplifier and the sub-word line driver.

According to some embodiments, the first peripheral region PR1 may include a power capacitor (or decoupling capacitor) that filters noise between operating voltages that are provided to the semiconductor memory device.

Figure 3:
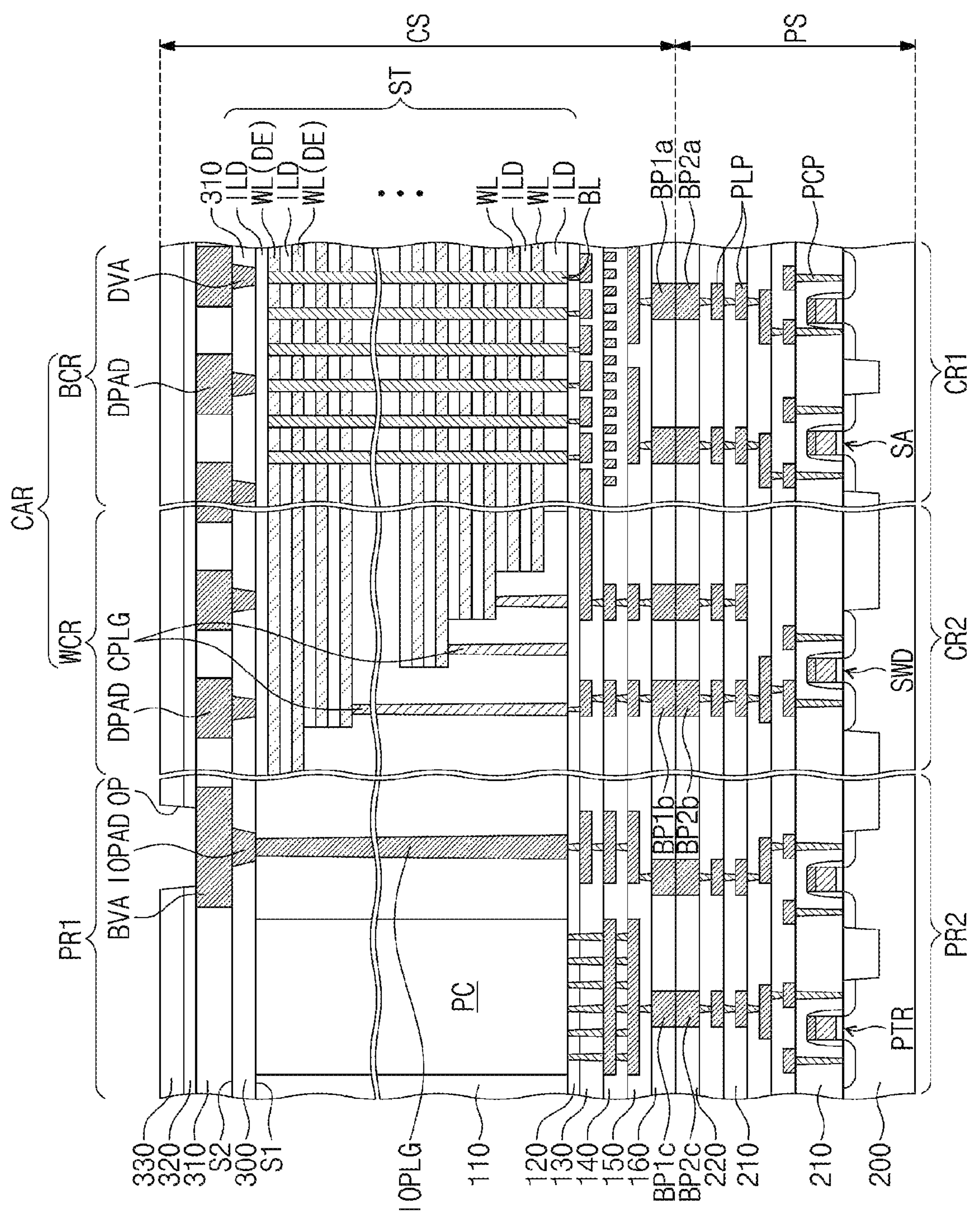
FIG. 3 illustrates a cross-sectional view showing a semiconductor memory device according to some embodiments of the present inventive concepts.
Figure 4:
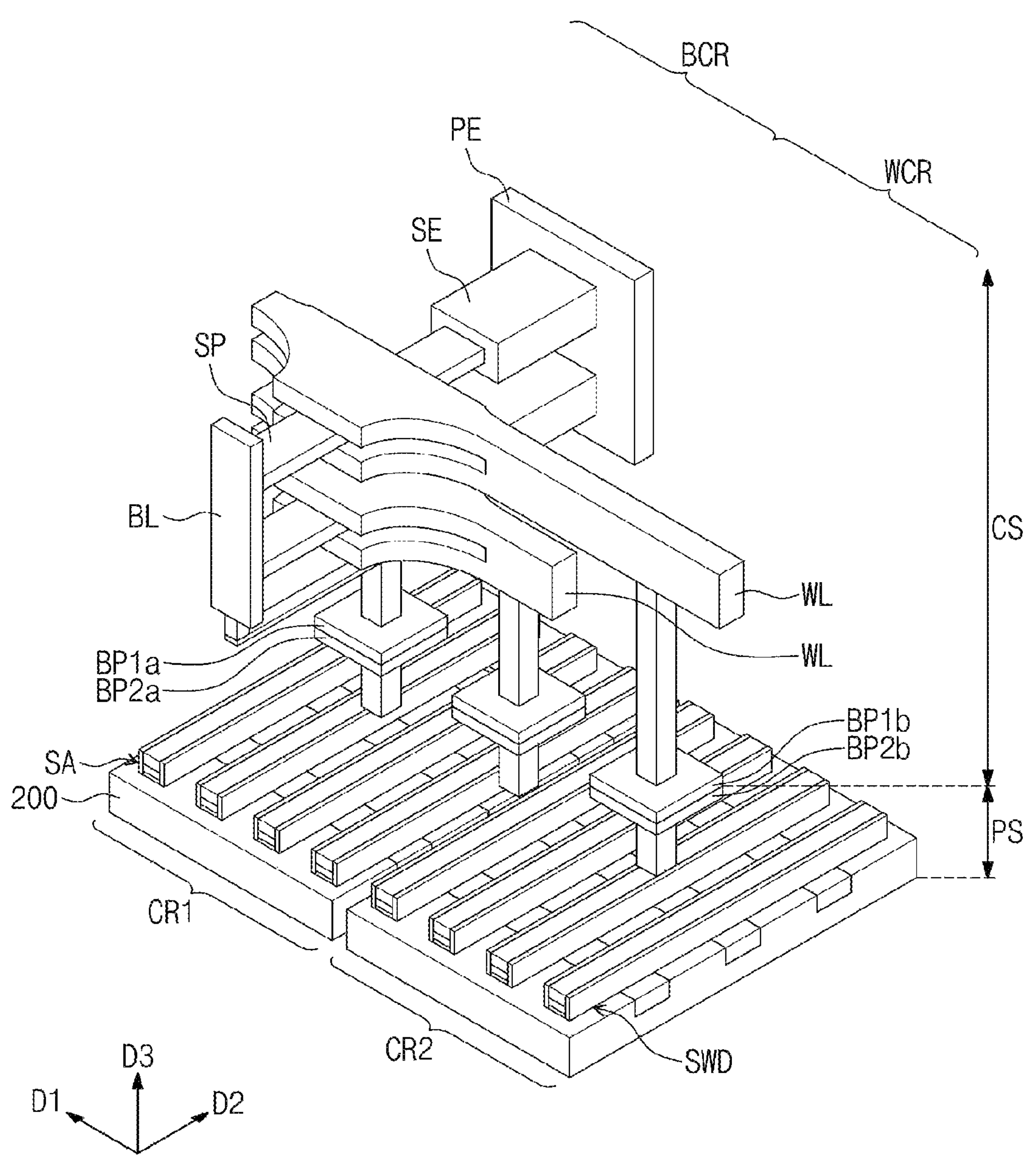
FIG. 4 illustrates a perspective view partially showing a semiconductor memory device according to some embodiments of the present inventive concepts.

FIG. 3 illustrates a cross-sectional view showing a semiconductor memory device according to some embodiments of the present inventive concepts. FIG. 4 illustrates a perspective view partially showing a semiconductor memory device according to some embodiments of the present inventive concepts.

Referring to FIGS. 3 and 4, a semiconductor memory device may have a chip-to-chip (C2C) structure. The C2C structure may be fabricated by: forming, on a first wafer, an upper chip including a cell array structure CS; forming, on a second wafer different from the first wafer, a lower chip including a peripheral circuit structure PS; and then using a bonding method to connect the upper and lower chips to each other. For example, the bonding method may include electrically connecting a bonding metal formed on an uppermost metal layer of the upper chip to a bonding metal formed on an uppermost metal layer of the lower chip. For example, when the bonding metal is formed of copper (Cu), the bonding method may be a Cu-to-Cu bonding method, and the bonding metal may also be formed of aluminum (Al) or tungsten (W). In addition, according to some embodiments, the cell array structure CS may be provided thereon with input/output pads IOPAD to which powers and signals are input from external (e.g., external devices).

For example, the cell array structure CS may include a cell array region CAR and a first peripheral region PR1, and the cell array region CAR may include a bit-line connection region BCR and a word-line connection region WCR.

On the cell array region CAR, the cell array structure CS may include horizontal patterns (e.g., word lines) that are sequentially stacked on a lower dielectric layer 300 which will be discussed below, vertical patterns (e.g., bit lines) that vertically pass through the horizontal patterns, and memory elements interposed between the horizontal and vertical patterns.

For example, the cell array structure CS may include a lower dielectric layer 300, word lines WL, bit lines BL, a power capacitor PC, an input/output contact plug IOPLG, and first bonding pads BP1*a*, BP1*b*, and BP1*c*.

The lower dielectric layer 300 may have a first surface S1 and a second surface S2 that are opposite to each other. The lower dielectric layer 300 may be provided on its first surface S1 with a stack structure ST in which interlayer dielectric patterns ILD and the word lines WL are stacked alternately with each other.

The word lines WL may be or may extend parallel to the first surface S1 of the lower dielectric layer 300, and the bit lines BL may extend in a third direction D3 that is perpendicular to the first surface S1 of the lower dielectric layer 300. It is explained in some embodiments of the present inventive concepts that the word lines WL are parallel to the first surface S1 of the lower dielectric layer 300, but the present inventive concepts are not limited thereto. For example, in some embodiments, the bit lines BL may be parallel to the first surface S1 of the lower dielectric layer 300, and the word lines WL may extend in the third direction D3.

The word lines WL may extend from the bit-line connection region BCR toward the word-line connection region WCR, and the bit lines BL may be provided on the bit-line connection region BCR. On the word-line connection region WCR, the word lines WL may include pad portions connected to cell contact plugs CPLG. The word lines WL may be stacked to have a stepwise structure on the word-line connection region WCR. The pad portions of the word lines WL may be located at positions that are horizontally and vertically different from each other. In some embodiments, the word lines WL may include dummy word lines DE adjacent to the lower dielectric layer 300.

According to some embodiments, as illustrated in FIG. 4, each of the word lines WL may have a double gate structure that extends along opposite sides of a semiconductor pattern SP. The semiconductor pattern SP may have a first lateral surface connected to the bit line BL, and may also have a second lateral surface connected to the word line WL. With reference to FIGS. 5 to 8, the following will discuss in detail the cell array structure CS according to some embodiments of the present inventive concepts.

On the word-line connection region WCR and the first peripheral region PR1, a planarized dielectric layer 110 may be disposed on the first surface S1 of the lower dielectric layer 300. The planarized dielectric layer 110 may cover a stepwise structure of the stack structure ST. For example, the planarized dielectric layer 110 may cover the pad portions of the word lines W L.

On the first peripheral region PR1, the power capacitor PC may be provided on the lower dielectric layer 300. The power capacitor PC may constitute a voltage generator that receives power voltages input to the input/output pad IOPAD and outputs operating voltages that operate the memory cell array. In addition, the power capacitor PC may filter noise between operating powers that are input through the input/output pad IOPAD. For example, the power capacitor PC may be a metal-insulator-metal (MIM) capacitor that includes a first electrode, a second electrode, and a dielectric layer between the first and second electrodes.

On the first peripheral region PR1, the input/output contact plug IOPLG may penetrate the planarized dielectric layer 110. One or more input/output contact plugs IOPLG may be connected, through contact plugs and conductive lines, to the first bonding pads BP1*a*, BP1*b*, and BP1*c*.

In some embodiments, the first bonding pads BP1*a*, BP1*b*, and BP1*c* of the cell array structure CS may include first upper bonding pads BP1*a* provided on the bit-line connection region BCR, second upper bonding pads BP1*b* provided on the word-line connection region WCR, and third upper bonding pads BP1*c* provided on the first peripheral region PR1.

The first upper bonding pads BP1*a* may be electrically connected to the bit lies BL through conductive lines and contact plugs, and the second upper bonding pads BP1*b* may be electrically connected to the word lines WL through conductive lines and contact plugs. The third upper bonding pads BP1*c* may be connected the power capacitor PC and the input/output contact plug IOPLG through conductive lines and contact plugs.

The peripheral circuit structure PS may include as semiconductor substrate 200, core and peripheral circuits SA, SWD, and PTR on the semiconductor substrate 200, and second bonding pads BP2*a*, BP2*b*, and BP2*c*.

The peripheral circuit structure PS may include a first core region CR1, a second core region CR2, and a second peripheral region PR2.

On the first core region CR1, a plurality of sense amplifiers SA may be provided on the semiconductor substrate 200. On the second core region CR2, a plurality of sub-word line drivers SWD may be provided on the semiconductor substrate 200. On the second peripheral region PR2, a plurality of control circuits PTR may be provided on the semiconductor substrate 200.

The semiconductor substrate 200 may be provided with peripheral interlayer dielectric layers 210 and 220 on a top surface thereof. On the semiconductor substrate 200, the peripheral interlayer dielectric layers 210 and 220 may cover the peripheral circuits SA, SWD, and PTR, peripheral contact plugs PCP, and peripheral circuit lines PLP. The peripheral contact plugs PCP and the peripheral circuit lines PLP may be electrically connected to the peripheral circuits SA, SWD, and PTR. The peripheral interlayer dielectric layers 210 and 220 may include, for example, one or more of a silicon oxide layer, a silicon nitride layer, a silicon oxynitride layer, and a low-k dielectric layer.

The second bonding pads BP2*a*, BP2*b*, and BP2*c* of the peripheral circuit structure PS may include first lower bonding pads BP2*a* provided on the first core region CR1, second lower bonding pads BP2*b* provided on the second core region CR2, and third lower bonding pads BP2*c* provided on the second peripheral region PR2.

The first lower bonding pads BP2*a* may be electrically connected to the sense amplifiers SA through conductive lines and contact plugs. The second lower bonding pads BP2*b* may be electrically connected to the sub-word line drivers SWD through conductive lines and contact plugs. The third lower bonding pads BP2*c* may be electrically connected to the control circuits PTR through conductive lines and contact plugs.

In some embodiments, the first, second, and third lower bonding pads BP2*a*, BP2*b*, and BP2*c* may be directly connected to the first, second, and third upper bonding pads BP1*a*, BP1*b*, and BP1*c*, respectively. The first, second, and third lower and upper bonding pads BP1*a*, BP1*b*, BP1*c*, BP2*a*, BP2*b*, and BP2*c* may include the same metallic material, and may have substantially the same size and area. The first, second, and third lower and upper bonding pads BP1*a*, BP1*b*, BP1*c*, BP2*a*, BP2*b*, and BP2*c* may include, for example, copper (Cu), aluminum (Al), nickel (Ni), cobalt (Co), tungsten (W), titanium (Ti), tin (Sn), and/or any alloy thereof. As used herein the term "and/or" includes any and all combinations of one or more of the associated listed items.

According to some embodiments, input/output pads IOPAD and dummy pads DPAD may be disposed on the second surface S2 of the lower dielectric layer 300.

On the first peripheral region PR1, the input/output pads IOPAD may be connected through input/output vias BVA to the contact plugs IOPLG. The dummy pads DPAD may be provided on the bit-line connection region BCR and the word-line connection region WCR. The dummy pads DPAD may be connected to dummy vias DVA. The dummy vias DVA may be surrounded by a dielectric material and may be electrically floated, and the dummy pads DPAD and the dummy vias DVA may be provided as paths through which hydrogen is provided when a semiconductor memory device is fabricated. For example, the input/output pads IOPAD and the dummy pads DPAD may include a metallic material, such as aluminum.

A protection layer 310 may be disposed on the second surface S2 of the lower dielectric layer 300, and the protection layer 310 may cover the input/output pads IOPAD and the dummy pads DPAD. The protection layer 310 may be, for example, a hydrogen-containing oxide layer. A hydrogen concentration of the protection layer 310 may be greater than that of the lower dielectric layer 300. The protection layer 310 may be a high density plasma (HDP) oxide layer or a tetraethylorthosilicate (TEOS) layer.

A capping dielectric layer 320 and a passivation layer 330 may be sequentially formed on the protection layer 310. The capping dielectric layer 320 and the passivation layer 330 may have a pad opening OP that exposes a portion of the input/output pad IOPAD.

The capping dielectric layer 320 may include, for example, a silicon nitride layer and/or a silicon oxynitride layer. The passivation layer 330 may include a polyimide-based material, such as photosensitive polyimide (PSPI).

Figure 5:
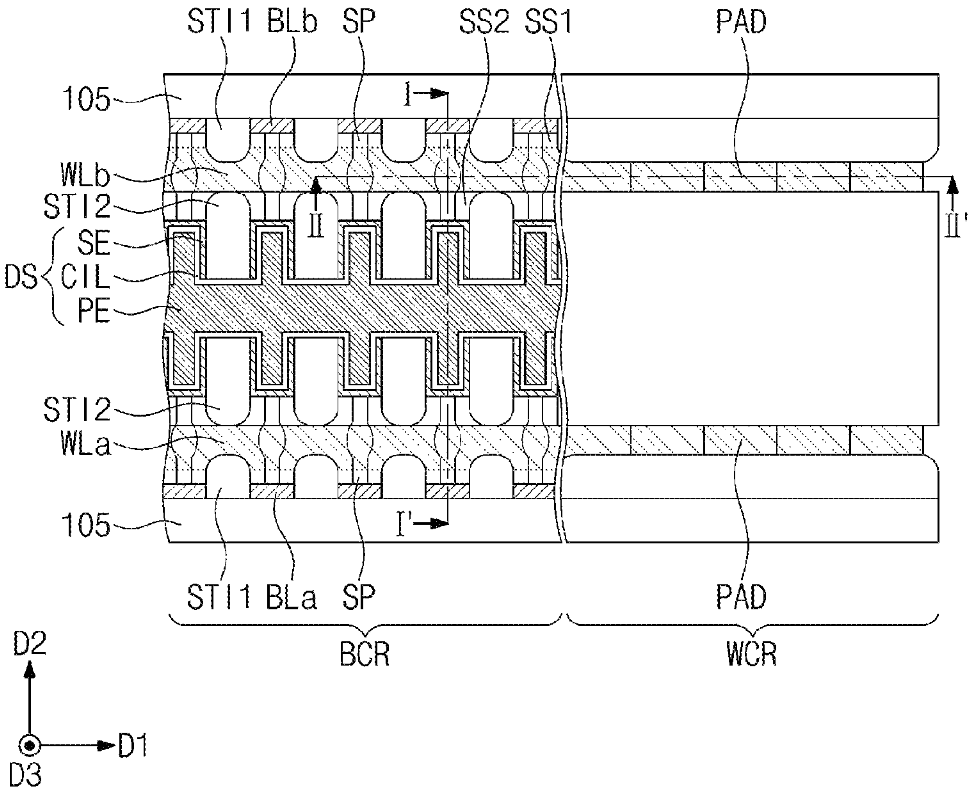
FIG. 5 illustrates a plan view showing a cell array structure of a semiconductor memory device according to some embodiments of the present inventive concepts.
Figure 6:
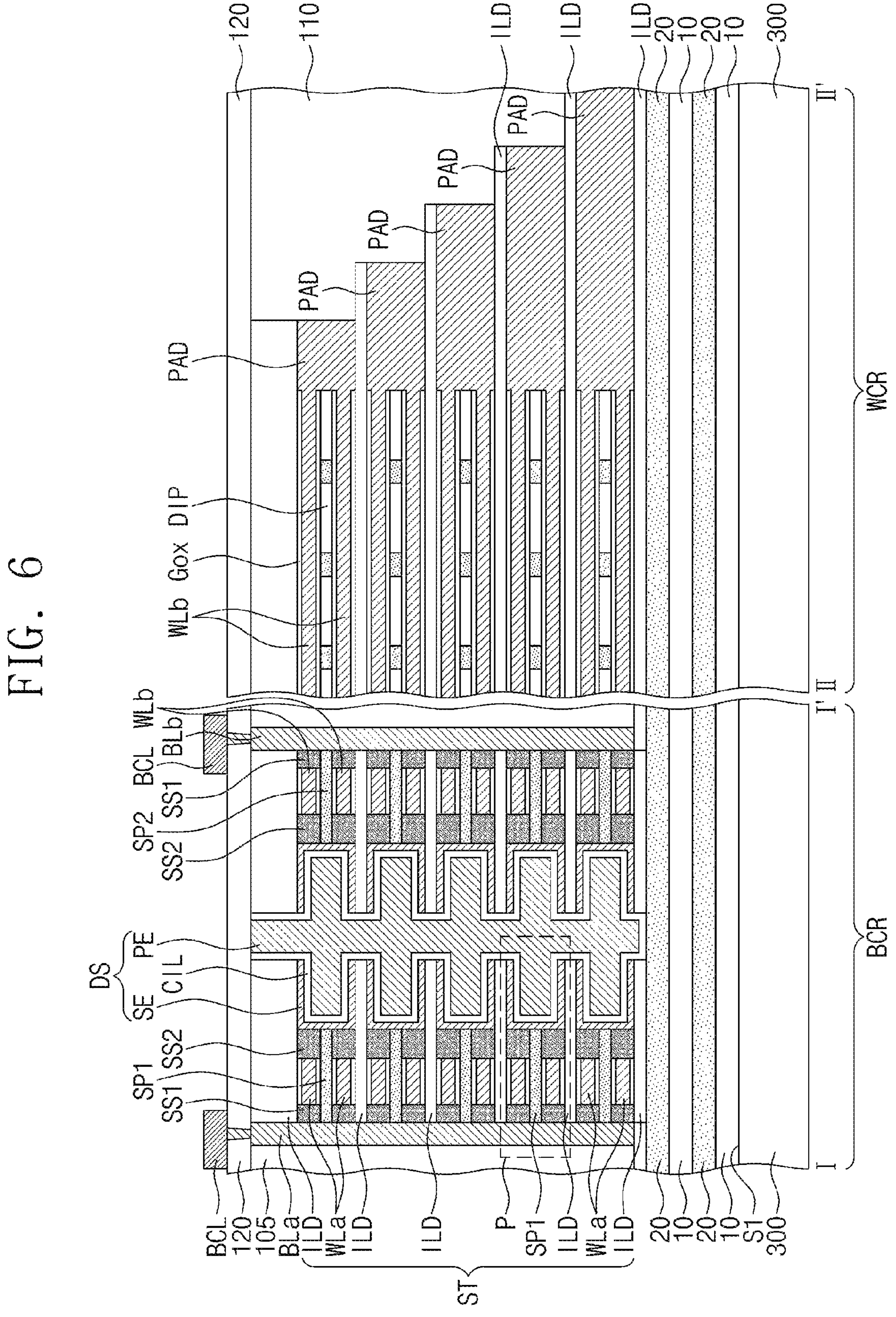
FIG. 6 illustrates a cross-sectional view taken along lines I-I' and II-II' of FIG. 5, showing a cell array structure of a semiconductor memory device according to some embodiments of the present inventive concepts.
Figure 7:
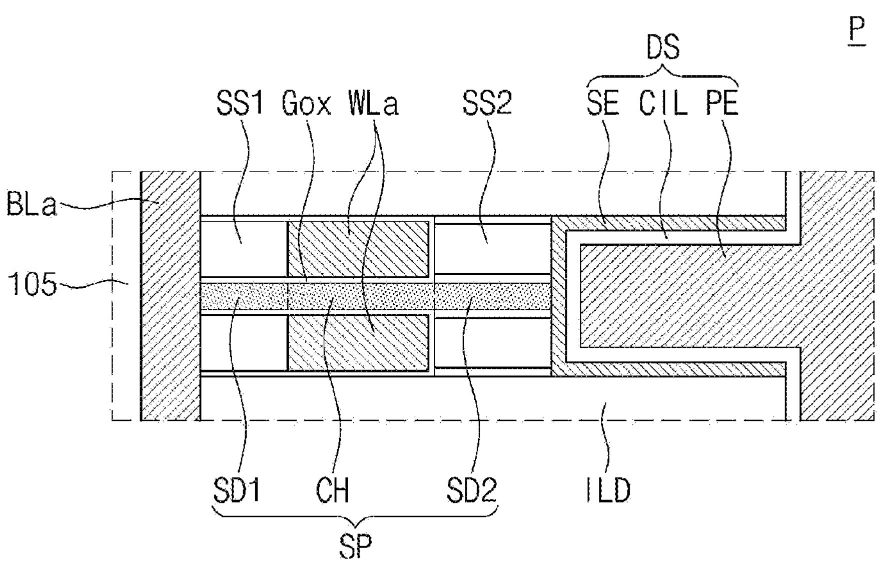
FIG. 7 illustrates an enlarged view showing section P of FIG. 6.
Figure 8:
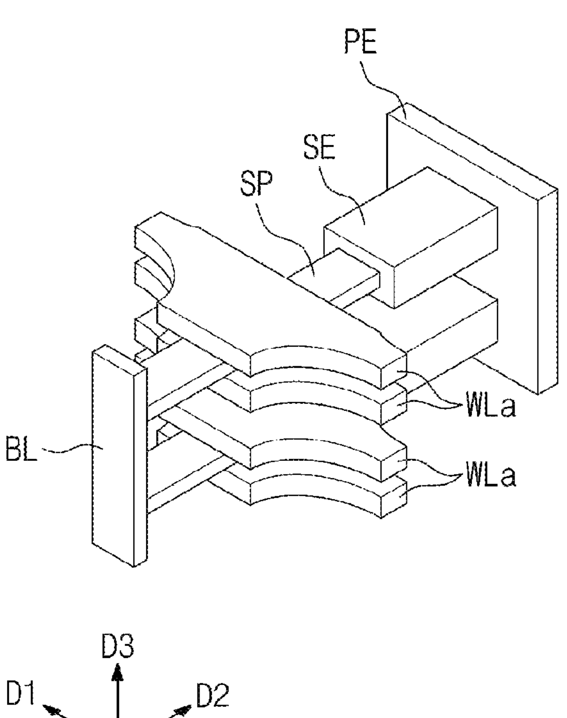
FIG. 8 illustrates a perspective view partially showing a cell array structure of a semiconductor memory device according to some embodiments of the present inventive concepts.

FIG. 5 illustrates a plan view showing a cell array structure of a semiconductor memory device according to some embodiments of the present inventive concepts. FIG. 6 illustrates a cross-sectional view taken along lines I-I' and II-II' of FIG. 5, showing a cell array structure of a semiconductor memory device according to some embodiments of the present inventive concepts. FIG. 7 illustrates an enlarged view showing a section P of FIG. 6. FIG. 8 illustrates a perspective view partially showing a cell array structure of a semiconductor memory device according to some embodiments of the present inventive concepts.

Referring to FIGS. 5 and 6, stack structures ST may be disposed on the first surface S1 of the lower dielectric layer 300. The stack structures ST may extend in a first direction D1 and may be spaced apart from each other in a second direction D2 that intersects the first direction D1. The first and second directions D1 and D2 may be parallel to the first surface S1 (or a top surface) of the lower dielectric layer 300.

According to some embodiments, first and second semiconductor layers 10 and 20 may be positioned between the stack structures ST and the lower dielectric layer 300. The first and second semiconductor layers 10 and 20 may be stacked alternately with each other and may include different semiconductor materials from each other. For example, the first semiconductor layers 10 may each be a single-crystalline silicon layer, and the second semiconductor layers 20 may each be a silicon-germanium layer. A lowermost first semiconductor layer 10 may be in contact with the first surface S1 of the lower dielectric layer 300. The first and second semiconductor layers 10 and 20 may be materials that remain when a semiconductor memory device is fabricated. In some embodiments, as illustrated in FIG. 3, neither the first semiconductor layers 10 nor the second semiconductor layers 20 may remain between the stack structures ST and the lower dielectric layer 300. In this case, the first surface S1 of the lower dielectric layer 300 may be in contact with a dummy word line DE or an interlayer dielectric pattern ILD of the stack structure ST.

Each of the stack structures ST may include word lines WLa and WLb and interlayer dielectric patterns ILD that are alternately stacked along the third direction D3 (or a vertical direction) perpendicular to the first and second directions D1 and D2.

The word lines WLa and WLb may include, for example, doped semiconductor materials (doped silicon, doped germanium, etc.), conductive metal nitrides (titanium nitride, tantalum nitride, etc.), metals (tungsten, titanium, tantalum, etc.), and/or metal-semiconductor compounds (tungsten silicide, cobalt silicide, titanium silicide, etc.).

In some embodiments, as illustrated in FIG. 8, the word lines WLa and WLb may each have a double gate structure provided on top and bottom surfaces of the semiconductor pattern SP. In some embodiments, the word lines WLa and WLb may each have a structure (or a gate-all-around structure) that completely surrounds the semiconductor pattern SP.

In some embodiments, the word lines WLa and WLb may include first and second word lines WLa and WLb that face each other in the second direction D2. As illustrated in FIG. 5, each of the first and second word lines WLa and WLb may include a line portion that extends in the first direction D1 parallel to the first surface S1 of the lower dielectric layer 300, and may also have gate electrode portions that protrude in the second direction D2 from the line portion. The line portion may be disposed between first and second separation dielectric patterns STI1 and STI2. In addition, when viewed in the second direction D2, the gate electrode portion may have a width greater than that of the line portion. When viewed in plan, the first and second word lines WLa and WLb may be mirror-symmetric about a plate electrode PE.

On the word-line connection region WCR, each of the word lines WLa and WLb may have a pad portion PAD. The pad portions PAD of the word lines WLa and WLb may be stacked to constitute a stepwise structure, and the planarized dielectric layer 110 may cover the pad portions PAD. The word lines WLa and WLb may have their lengths in the first direction D1, and the lengths of the word lines WLa and WLb may decrease with increasing distance from the lower dielectric layer 300.

A plurality of semiconductor patterns SP may be stacked in the third direction D3, and may be spaced apart from each other in the first and second directions D1 and D2. For example, the semiconductor patterns SP may be three-dimensionally arranged on the lower dielectric layer 300. When the word lines WLa and WLb have a double gate structure, dummy dielectric patterns DIP may be disposed between a pair of sub-word lines and between the semiconductor patterns SP arranged along the first direction D1.

The semiconductor patterns SP may include, for example, silicon (Si), germanium (Ge), and/or silicon-germanium (SiGe). For example, the semiconductor patterns SP may be formed of single-crystalline silicon. In some embodiments, the semiconductor patterns SP may have bandgap energy greater than that of silicon. For example, the semiconductor patterns SP may have bandgap energy of about 1.5 eV to about 5.6 eV. For example, when the semiconductor patterns SP have bandgap energy of about 2.0 eV to about 4.0 eV, the semiconductor patterns SP may have an optimum channel capacity. The semiconductor patterns SP may include an oxide semiconductor, such as ZnxSnyO (ZTO), InxZnyO (IZO), ZnxO, InxGayZnzO (IGZO), InxGaySizO (IGSO), InxWyO (IWO), InxO, SnxO, TixO, ZnxONz, MgxZnyO, ZrxInyZnzO, HfxInyZnzO, SnxInyZnzO, AlxSnyInzZnaO, SixInyZnzO, AlxZnySnzO, GaxZnySnzO, ZrxZnySnzO, or any combination thereof.

As illustrated in FIGS. 7 and 8, each of the semiconductor patterns SP may have a bar shape that has a major axis in the second direction D2.

For example, referring to FIG. 7, each of the semiconductor patterns SP may include first and second source/drain regions SD1 and SD2 that are spaced apart from each other, and may also include a channel region CH between the first and second source/drain regions SD1 and SD2. Impurities may be doped into the first and second source/drain regions SD1 and SD2 of each semiconductor pattern SP.

Gate dielectric layers Gox may be interposed between the word lines WLa and WLb and the channel regions CH of the semiconductor patterns SP. The gate dielectric layers Gox may include, for example, a high-k dielectric layer, a silicon oxide layer, a silicon nitride layer, a silicon oxynitride layer, or a combination thereof. For example, the high-k dielectric layer may include at least one selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

First spacer dielectric patterns SS1 may be correspondingly disposed between the interlayer dielectric patterns ILD that are vertically adjacent to each other. The first spacer dielectric pattern SS1 may surround the first source/drain region SD1 of the semiconductor pattern SP. A second spacer dielectric pattern SS2 may surround the second source/drain region SD2 of the semiconductor pattern SP.

The semiconductor pattern SP may have a first lateral surface in contact with a bit line BL and a second lateral surface in contact with a storage electrode SE.

Referring back to FIGS. 5 and 6, bit lines BLa and BLb may cross the word lines WLa and WLb and extend in the third direction D3 perpendicular to the first surface S1 of the lower dielectric layer 300. The bit lines BLa and BLb may have their lengths that are substantially the same in the third direction D3. The bit lines BLa and BLb may be arranged spaced apart from each other in the first direction D1 and the second direction D2. Each of the bit lines BLa and BLb may be connected to the first source/drain region SD1 of the semiconductor patterns that are stacked in the third direction D3. The bit lines BLa and BLb may be connected through contact plugs to bit-line connection lines BCL on a first interlayer dielectric layer 120.

A data storage element DS may be connected to the second source/drain region SD2 of each semiconductor pattern SP. In some embodiments, the data storage element DS may be a capacitor, and may include a storage electrode SE, a plate electrode PE, and a capacitor dielectric layer CIL between the storage electrode SE and the plate electrode PE.

The storage electrode SE may be connected to the second source/drain region SD2 of each semiconductor pattern SP. The storage electrodes SE may be located at substantially the same levels as those of the semiconductor patterns SP. For example, the storage electrodes SE may be stacked in the third direction D3 and may each have a major axis in the second direction D2. The storage electrodes SE may be correspondingly disposed between the interlayer dielectric patterns ILD that are vertically adjacent to each other.

The capacitor dielectric layer CIL may conformally cover surfaces of the storage electrodes SE. The plate electrode PE may fill insides of the storage electrodes SE in which the capacitor dielectric layer CIL is formed.

The first separation dielectric patterns STI1 may be correspondingly disposed between the bit lines BLa and BLb that are adjacent to each other in the first direction D1. The first separation dielectric patterns STI1 may extend in the third direction D3.

The second separation dielectric patterns STI2 may be correspondingly disposed between the storage electrodes SE that are adjacent to each other in the first direction D1. The second separation dielectric patterns STI2 may extend in the third direction D3.

Buried dielectric patterns 105 may extend along the first direction D1 on the lower dielectric layer 300. The buried dielectric patterns 105 may cover sidewalls of the bit lines BLa and BLb and sidewalls of the first separation dielectric patterns STI1. The buried dielectric patterns 105 may be, for example, one of a silicon oxide layer, a silicon oxynitride layer, and dielectric materials formed by using spin-on-glass (SOG) technology.

FIGS. 9 to 15 illustrate cross-sectional views showing a method of fabricating a semiconductor memory device according to some embodiments of the present inventive concepts.

Figure 9:
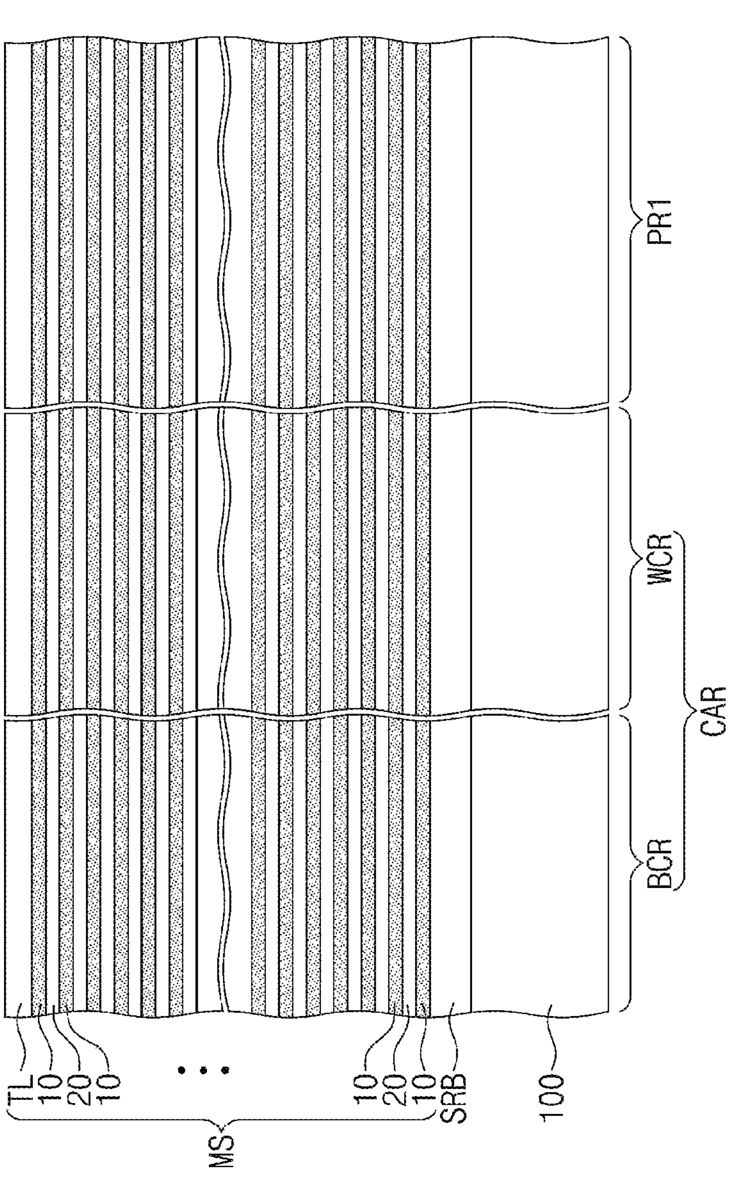

Referring to FIG. 9, a buffer layer SRB may be formed on a first semiconductor substrate 100. The first semiconductor substrate 100 may have a memory cell array region CAR and a first peripheral region PR1, and the memory cell array region CAR may be divided into a bit-line connection region BCR and a word-line connection region WCR.

The first semiconductor substrate 100 may be, for example, a single-crystalline silicon substrate or a silicon-on-insulator (SOI) substrate.

The buffer layer SRB may be formed on an entire surface of the first semiconductor substrate 100. The buffer layer SRB may include, for example, silicon-germanium (SiGe). A germanium concentration of the buffer layer SRB may range from about 1 at %% to about 15 at %. The buffer layer SRB may be formed by using a selective epitaxial growth process. The buffer layer SRB may be formed to have a thickness of, for example, about 3 μm to about 15 μm.

A mold structure MS may be formed to include first semiconductor layers 10 and second semiconductor layers 20 that are alternately stacked on the buffer layer SRB.

The first semiconductor layers 10 may include, for example, silicon, germanium, silicon-germanium, and/or indium gallium zinc oxide (IGZO). In some embodiments, the first semiconductor layers 10 may include the same semiconductor material as that of the first semiconductor substrate 100. For example, the first semiconductor layers 10 may be formed by an epitaxial growth method and may be a single-crystalline silicon layer.

The second semiconductor layers 20 may include or may be formed of, for example, one or more of a silicon-germanium layer, a silicon oxide layer, a silicon nitride layer, and a silicon oxynitride layer. In some embodiments, the second semiconductor layers 20 may be formed by an epitaxial growth method and may be a silicon-germanium layer. When the second semiconductor layers 20 include silicon-germanium, a germanium concentration of the second semiconductor layer 20 may be greater than that of the buffer layer SRB. For example, the germanium concentration of the second semiconductor layer 20 may range from about 15 at % to about 30 at %. The second semiconductor layer 20 may have a thickness substantially the same as or less than that of the first semiconductor layer 10.

An upper dielectric layer TL may be formed on the mold structure MS, covering an uppermost second semiconductor layer 20. The upper dielectric layer TL may be formed of a dielectric material having an etch selectivity with respect to the first semiconductor layers 10 and the second semiconductor layers 20. For example, the upper dielectric layer TL may be a silicon oxide layer.

Figure 10:
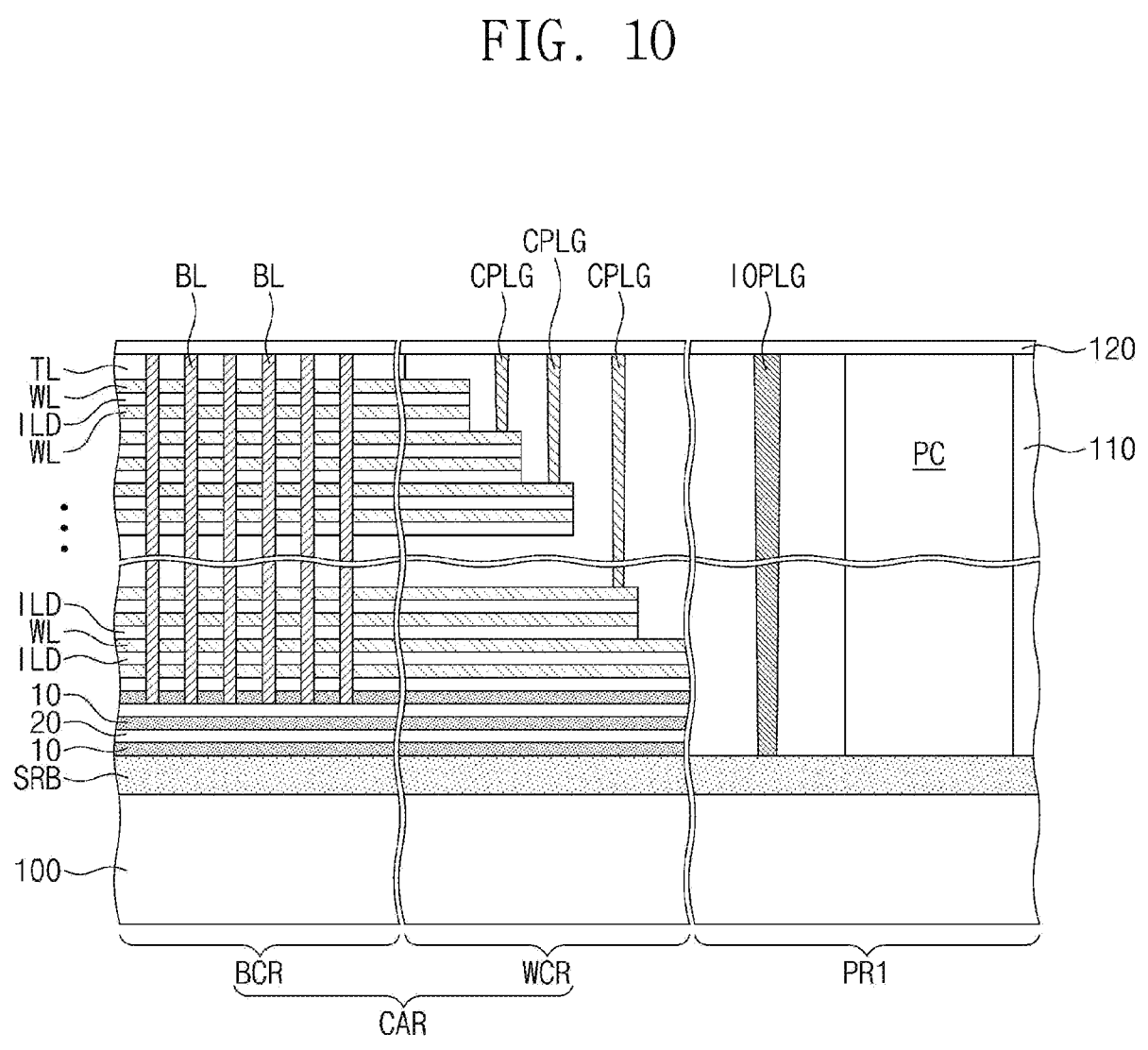

Referring to FIG. 10, the second semiconductor layers 20 of the mold structure MS may be replaced with interlayer dielectric patterns ILD, and the first semiconductor layers 10 of the mold structure MS may be formed into semiconductor patterns SP discussed with reference to FIGS. 6 and 8.

According to some embodiments, portions of the first semiconductor layers 10 may remain to form the semiconductor patterns SP, and then word lines WL may be formed.

Before the formation of the word lines WL, the mold structure MS may undergo a patterning process such that the mold structure MS may be patterned to have a stepwise structure on the word-line connection region WCR. A planarized dielectric layer 110 may be formed to cover the stepwise structure of the mold structure MS, and thereafter a replacement process may be performed to allow the word lines WL to have a stepwise structure on the word-line connection region WCR. When the mold structure MS is patterned, the buffer layer SRB may be exposed and the planarized dielectric layer 110 may be formed on the buffer layer SRB. It is illustrated that the first and second semiconductor layers 10 and 20 of the mold structure MS are removed from the first peripheral region PR1, but the present inventive concepts are not limited thereto and the first and second semiconductor layers 10 and 20 may remain on the first peripheral region PR1.

The word lines WL may be formed to extend along top and bottom surfaces of each semiconductor pattern (see the semiconductor pattern SP of FIG. 8) on the bit-line connection region BCR. Each of the word lines WL may be disposed between the interlayer dielectric patterns ILD that are vertically adjacent to each other.

According to some embodiments, portions of the first and second semiconductor layers 10 and 20 of the mold structure MS may remain between the buffer layer SRB and a lowermost word line WL or between the buffer layer SRB and a lowermost interlayer dielectric pattern ILD. For example, the lowermost word line WL may be spaced apart from the buffer layer SRB.

After the formation of the word lines WL, bit lines BL may be formed, and the bit lines BL may extend in a direction that is perpendicular to a top surface of the first semiconductor substrate 100. Each of the bit lines BL may be in contact with lateral surfaces of the semiconductor patterns SP, as discussed above with reference to FIGS. 6 and 8. The bit lines BL may be vertically spaced apart from the buffer layer SRB.

After the formation of the bit lines BL, cell contact plugs CPLG may be formed to penetrate the planarized dielectric layer 110 and to be connected to the word lines WL, respectively.

A power capacitor PC and input/output contact plugs IOPLG may be formed in the planarized dielectric layer 110 on the first peripheral region PR1. The input/output contact plug IOPLG may penetrate the planarized dielectric layer 110 and contact the buffer layer SRB.

After the formation of the input/output contact plug IOPLG, a first interlayer dielectric layer 120 may be formed on the bit lines BL and the planarized dielectric layer 110.

Figure 11:
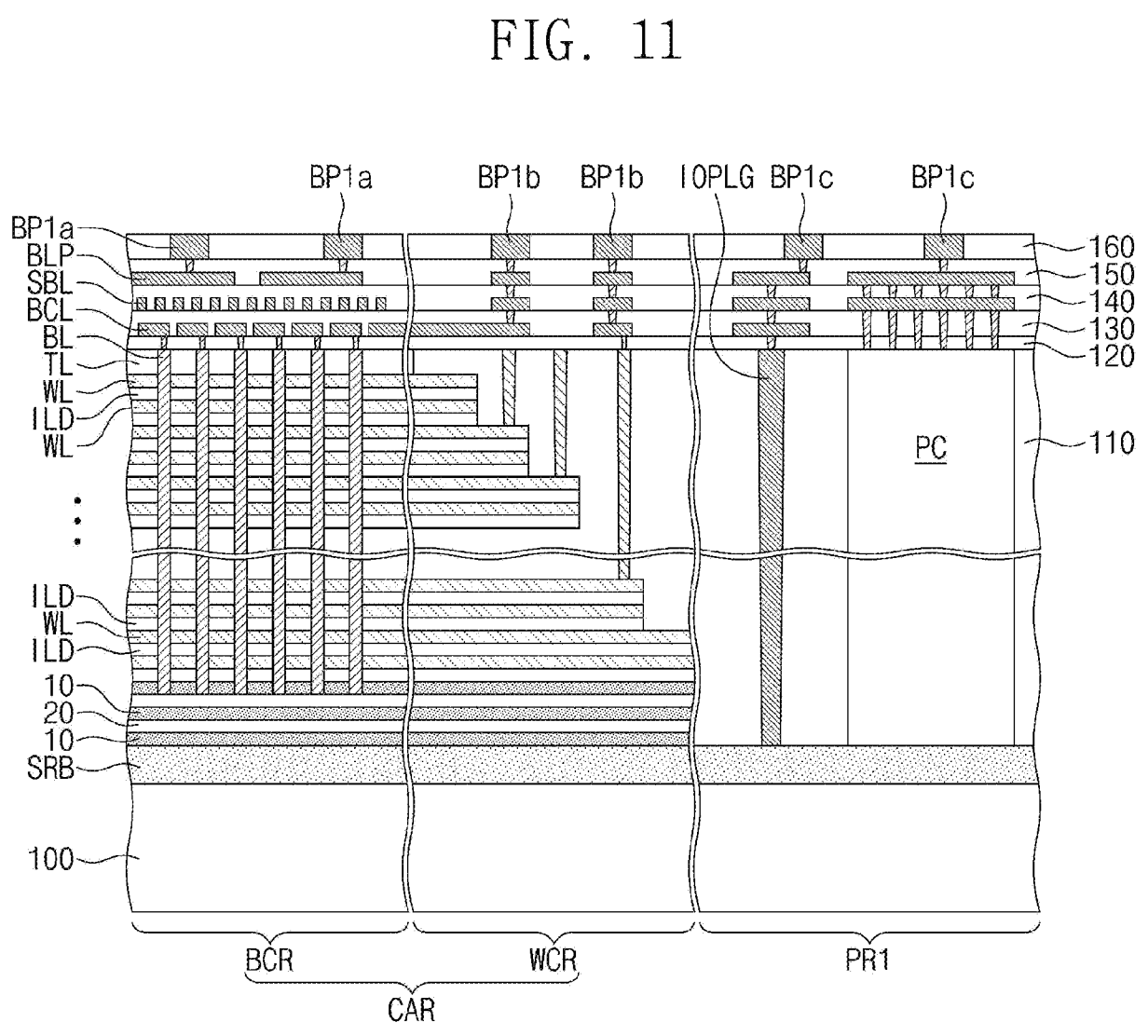

Referring to FIG. 11, a plurality of interlayer dielectric layers 130, 140, 150, and 160 may be formed on the first interlayer dielectric layer 120.

On the bit-line connection region BCR, connection lines BCL may be formed to be connected, through contact plugs, to the bit lines BL, respectively, and then sub-bit lines SBL and landing pads BLP may be sequentially formed on the connection lines BCL. In some embodiments, simultaneously, contact plugs and conductive lines connected to the cell contact plugs CPLG may be formed on the word-line connection region WCR. In addition, contact plugs and conductive lines connected to the input/output contact plug IOPLG and the power capacitor PC may be formed on the first peripheral region PR1.

After the formation of an uppermost interlayer dielectric layer 160, first bonding pads BP1*a*, BP1*b*, and BP1*c* may be formed in the uppermost interlayer dielectric layer 160. A damascene process may be performed to form the first bonding pads BP1*a*, BP1*b*, and BP1*c*.

Figure 12:
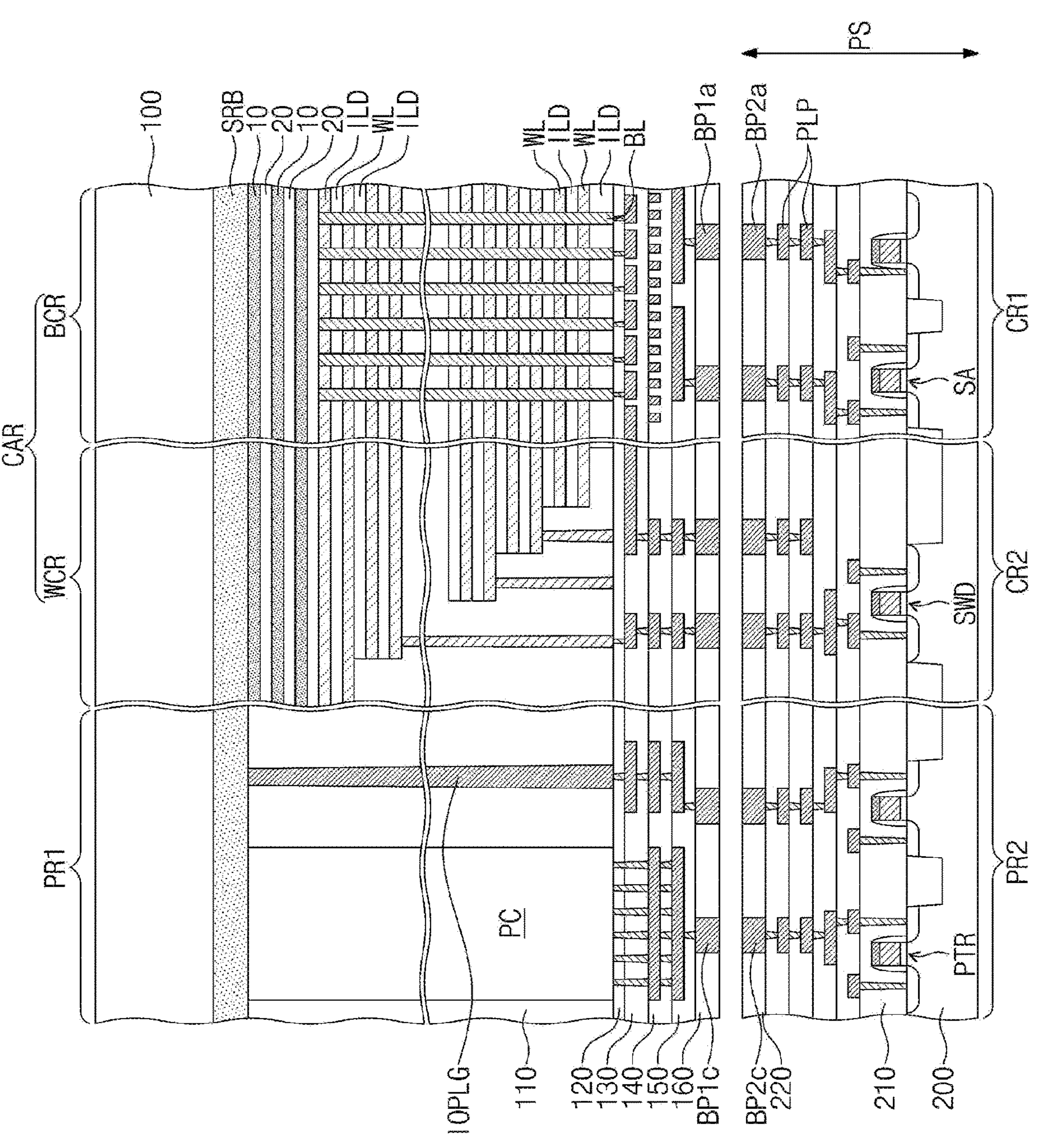

Referring to FIG. 12, there may be prepared a peripheral circuit structure PS including peripheral circuits SA, SWD, and PTR formed on a second semiconductor substrate 200 and second bonding pads BP2 connected to the peripheral circuits SA, SWD, and PTR.

According to some embodiments, the second semiconductor substrate 200 may have a first core region CR1, a second core region CR2, and a second peripheral region PR2. Sense amplifiers SA may be formed on the second semiconductor substrate 200 of the first core region CR1, and sub-word lines drivers SWD may be formed on the second semiconductor substrate 200 of the second core region CR2. In addition, control circuits PTR may be formed on the second semiconductor substrate 200 of the second peripheral region PR2.

The first bonding pads BP1*a*, BP1*b*, and BP1*c* of the first semiconductor substrate 100 may be bonded to the second bonding pads BP2*a*, BP2*b*, and BP2*c* of the second semiconductor substrate 200, respectively.

A bonding process may be performed in which the first bonding pads BP1*a*, BP1*b*, and BP1*c* are positioned to correspond to the second bonding pads BP2*a*, BP2*b*, and BP2*c*, and then a thermocompression process is performed. The thermocompression process may cause the absence of boundaries between the first bonding pads BP1*a*, BP1*b*, and BP1*c* and the second bonding pads BP2*a*, BP2*b*, and BP2*c*. Therefore, the first bonding pads BP1*a*, BP1*b*, and BP1*c* may be bonded to the second bonding pads BP2*a*, BP2*b*, and BP2*c*, and the uppermost interlayer dielectric layer 160 on the first semiconductor substrate 100 may be bonded to an uppermost peripheral interlayer dielectric layer 220 on the second semiconductor substrate 200.

After the bonding of the first bonding pads BP1*a*, BP1*b*, and BP1*c* to the second bonding pads BP2*a*, BP2*b*, and BP2*c*, the first semiconductor substrate 100 may be removed. The removal of the first semiconductor substrate 100 may include sequentially performing a grinding process, a planarization process, a wet etching process, and a dry etching process.

For example, the first semiconductor substrate 100 may be removed by a grinding process, and a portion of the buffer layer SRB may be removed by a planarization process (e.g., chemical mechanical polishing (CMP) process). A wet etching process may be performed on the buffer layer SRB. The wet etching process may be executed to allow the buffer layer SRB to have an etch selectivity with respect to the first semiconductor layer 10 of the mold structure MS. For example, a lowermost first semiconductor layer 10, or a single-crystalline silicon layer, may be used as a etch stop layer in the wet etching process. A surface roughness of the first semiconductor layer 10 exposed in the wet etching process may be less than that of the buffer layer SRB exposed in the planarization process.

Figure 13:
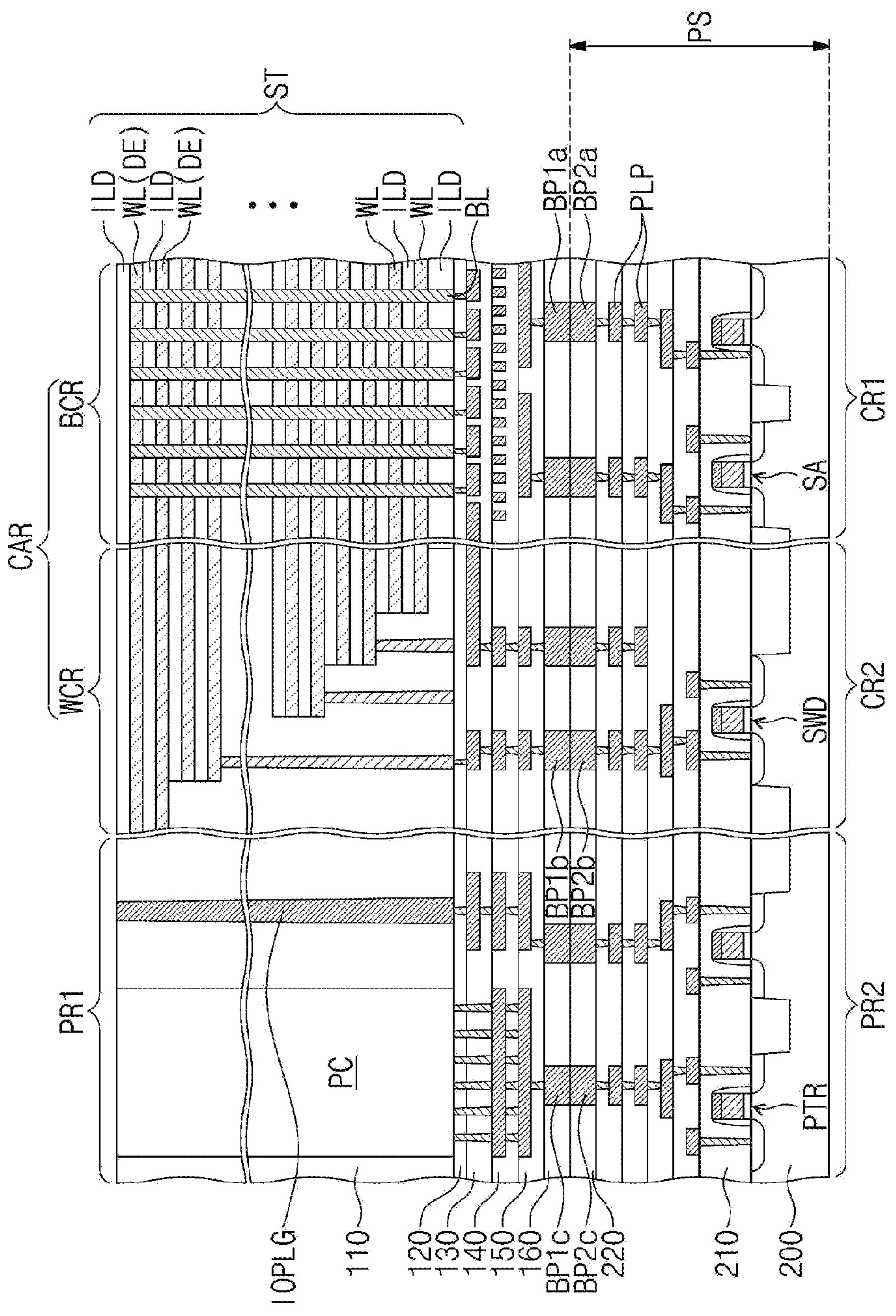

A dry etching process may be performed on portions of the first and second semiconductor layers 10 and 20. Therefore, as illustrated in FIG. 13, there may be exposed the input/output contact plug IOPLG and one of the interlayer dielectric pattern ILD and the word line WL.

Figure 14:
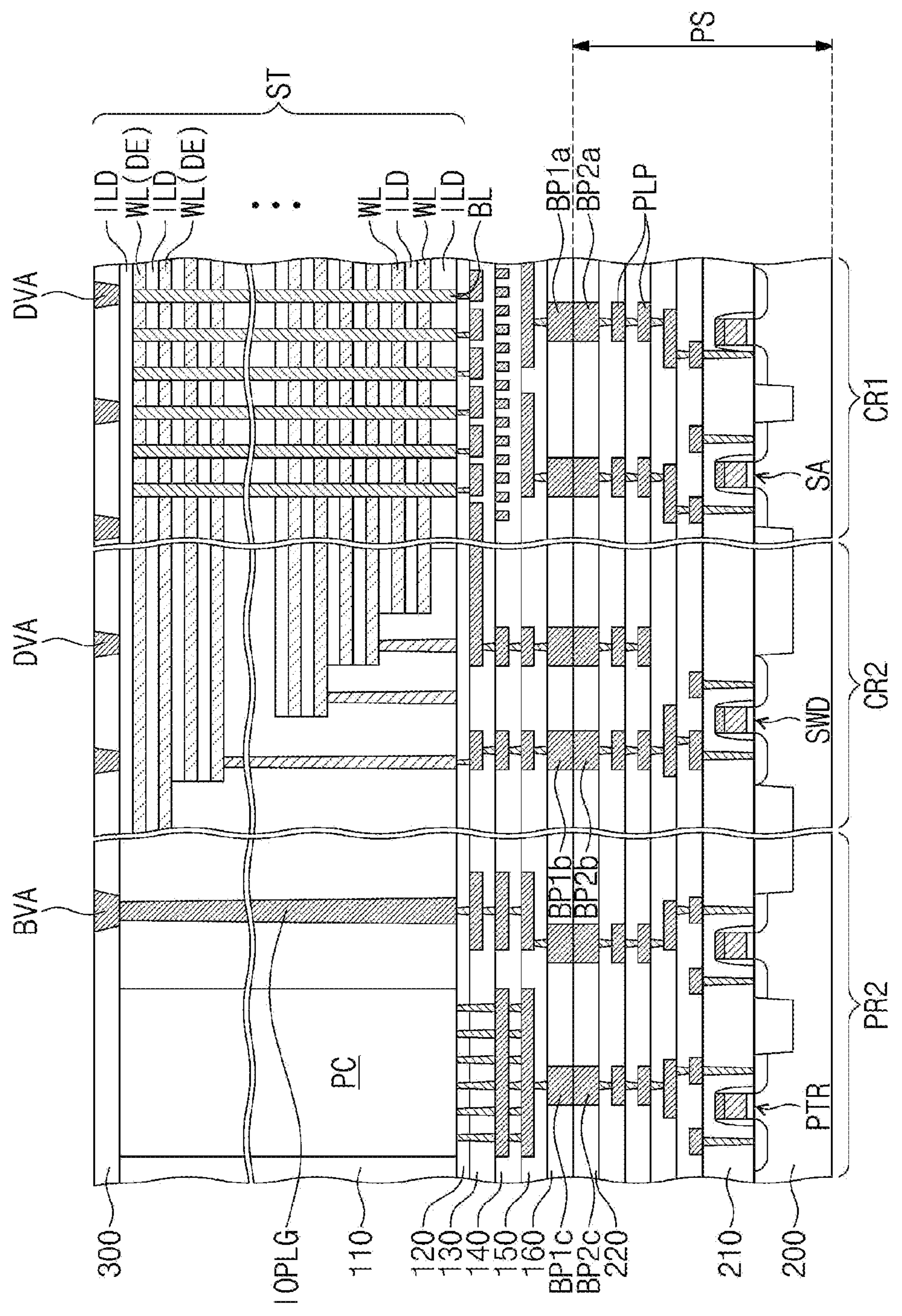

Referring to FIG. 14, after the removal of the first semiconductor substrate 100, a lower dielectric layer 300 may be formed on the stack structure ST and the planarized dielectric layer 110. The lower dielectric layer 300 may cover the input/output contact plug IOPLG.

After that, input/output vias BVA and dummy vias DVA may be formed in the lower dielectric layer 300. The input/output vias BVA and the dummy vias DVA may be formed by forming via holes that penetrate the lower dielectric layer 300, and then filling the via holes with a conductive material. The input/output vias BVA and the dummy vias DVA may include at least one selected from tungsten (W), titanium (Ti), tantalum (Ta), and nitride thereof.

The input/output via BVA may be connected to the input/output contact plug IOPLG. The dummy via DVA may be surrounded by a dielectric material, and may be electrically floated.

Referring back to FIG. 3, an input/output pad IOPAD and dummy pads DPAD may be formed on the lower dielectric layer 300. The input/output pad IOPAD and the dummy pads DPAD may be formed by depositing a metal layer on the lower dielectric layer 300 and patterning the metal layer. The input/output pad IOPAD and the dummy pads DPAD may include, for example, at least one selected from W, Al, Ti, Ta, Co, and Ru. For example, the input/output pad IOPAD and the dummy pads DPAD may include aluminum (Al).

After the formation of the input/output pad IOPAD and the dummy pads DPAD, as illustrated in FIG. 3, a protection layer 310 may be formed on the lower dielectric layer 300.

The protection layer 310 may cover the input/output pad IOPAD and the dummy pads DPAD, and may be formed of a dielectric material including hydrogen. The protection layer 310 may be formed by performing a deposition process that uses oxygen and silane, and when the deposition process is performed, oxygen may remain in the protection layer 310. For example, the protection layer 310 may be a high density plasma (HDP) oxide layer that contains hydrogen. A hydrogen concentration of the protection layer 310 may be greater than that of the lower dielectric layer 300.

The protection layer 310 may be formed by using, for example, plasma enhanced chemical vapor deposition (PECVD), high density plasma (HDP), or sputtering.

After the formation of the protection layer 310, a high-temperature annealing process (or a hydrogen treatment process) may be performed. In the annealing process, hydrogen may be transmitted through the dummy pads DPAD and the dummy vias DVA to transistors of a cell array. The annealing process may be performed at a temperature of about 300° C. to about 500° C. Therefore, it may be possible to prevent leakage currents that are produced due to silicon defects (e.g., dangling bonds) present on the cell array. Accordingly, a semiconductor memory device may increase in electrical properties.

A capping dielectric layer 320 and a passivation layer 330 may be sequentially formed on the protection layer 310. The capping dielectric layer 320 may include a silicon oxide layer, a silicon nitride layer, or a silicon oxynitride layer. The passivation layer 330 may include a polyimide-based material, such as photosensitive polyimide (PSPI). The passivation layer 330 may be formed by a spin coating process.

The capping dielectric layer 320 and the passivation layer 330 may be partially patterned to form an opening OP that exposes a portion of the input/output pad IOPAD.

As used herein, an element or region that is "covering" or "surrounding" or "filling" another element or region may completely or partially cover or surround or fill the other element or region.

According to some embodiments of the present inventive concepts, input/output pads and dummy pads may be disposed adjacent to a cell array structure, and thus the input/output pads and the dummy pads may be used as paths through which hydrogen is transmitted to a cell array. Therefore, in fabricating a semiconductor memory device, a hydrogen treatment process may increase electrical properties of memory cell arrays.

After bonding pads of a semiconductor memory device are bonded to each other, selectivity between a mold structure and a buffer layer may be used to remove a first semiconductor substrate, and thus it may be possible to reduce process variation and surface roughness of input/output pads and vias.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be made thereto without departing from the scope and spirit of the present inventive concepts.

What is claimed is:

1. A semiconductor memory device comprising:
- a cell array structure including a memory cell array and a plurality of first bonding pads electrically connected to the memory cell array; and
- a peripheral circuit structure including a plurality of second bonding pads bonded to the plurality of first bonding pads, respectively, wherein the cell array structure includes:
- a lower dielectric layer including a first surface and a second surface opposite to the first surface;
- a stack structure including a plurality of horizontal electrodes that are stacked in a vertical direction on the first surface of the lower dielectric layer;
- a vertical structure including a plurality of vertical conductive patterns that extend in the vertical direction and cross the plurality of horizontal electrodes; and
- an input/output pad on the second surface of the lower dielectric layer.

2. The semiconductor memory device of claim 1, wherein the cell array structure includes a bit-line connection region and a word-line connection region, wherein the plurality of first bonding pads include:
- a plurality of first upper bonding pads electrically connected to the plurality of vertical conductive patterns, respectively, on the bit-line connection region; and a plurality of second upper bonding pads electrically connected to the plurality of horizontal electrodes, respectively, on the word-line connection region.

3. The semiconductor memory device of claim 2, wherein the cell array structure further includes a plurality of power capacitors and an input/output plug on a first peripheral region, and the plurality of first bonding pads further include a plurality of third upper bonding pads, and each of the plurality of third upper bonding pads is electrically connected to a respective one of the plurality of power capacitors and the input/output plug on the first peripheral region.

4. The semiconductor memory device of claim 3, wherein, on the first peripheral region, the input/output pad is electrically connected to the input/output plug.

5. The semiconductor memory device of claim 2, further comprising a plurality of dummy pads on the bit-line connection region and the word-line connection region, the plurality of dummy pads being on the second surface of the lower dielectric layer.

6. The semiconductor memory device of claim 5, further comprising a passivation layer on the second surface of the lower dielectric layer, wherein the passivation layer extends on top surfaces of the plurality of dummy pads and includes an opening that exposes a top surface of the input/output pad.

7. The semiconductor memory device of claim 2, wherein the peripheral circuit structure includes:

a first core region that overlaps the bit-line connection region and includes a plurality of sense amplifiers; and a second core region that overlaps the word-line connection region and includes a plurality of sub-word line drivers.

8. The semiconductor memory device of claim 7, wherein the plurality of second bonding pads include:

a plurality of first lower bonding pads on the first core region and electrically connected to the plurality of sense amplifiers, respectively; and a plurality of second lower bonding pads on the second core region and electrically connected to the plurality of sub-word line drivers, respectively, wherein the plurality of first lower bonding pads are bonded to the plurality of first upper bonding pads, respectively, and wherein the plurality of second lower bonding pads are bonded to the plurality of second upper bonding pads, respectively.

9. The semiconductor memory device of claim 1, wherein the plurality of horizontal electrodes of the stack structure include, respectively, a plurality of word lines extending parallel to the first surface of the lower dielectric layer, and the plurality of vertical conductive patterns of the vertical structure include, respectively, a plurality of bit lines that extend perpendicular to the first surface of the lower dielectric layer.

10. The semiconductor memory device of claim 9, wherein the cell array structure further includes:

a plurality of semiconductor patterns that cross the plurality of word lines and are stacked in the vertical direction that is perpendicular to the first surface of the lower dielectric layer; and a plurality of data storage elements in contact with first lateral surfaces of the plurality of semiconductor patterns, respectively.

11. The semiconductor memory device of claim 10, wherein each of the plurality of bit lines is in contact with second lateral surfaces of the plurality of semiconductor patterns, the second lateral surfaces being opposite to the first lateral surfaces.

12. A semiconductor memory device, comprising:

a cell array structure including a plurality of memory cells and a plurality of first bonding pads electrically connected to the plurality of memory cells, respectively, the cell array structure including a cell array region on which the plurality of memory cells are provided and a first peripheral region adjacent the cell array region;

a peripheral circuit structure including a plurality of peripheral circuits and a plurality of second bonding pads electrically connected to the plurality of peripheral circuits, respectively, the plurality of second bonding pads being bonded to the plurality of first bonding pads, respectively; and a passivation layer including a plurality of input/output pads and a plurality of dummy pads, wherein, when viewed in cross section, the cell array structure is between the passivation layer and the peripheral circuit structure, wherein the plurality of input/output pads overlap the first peripheral region of the cell array structure, and wherein the plurality of dummy pads overlap the cell array region of the cell array structure.

13. The semiconductor memory device of claim 12, wherein the cell array structure further includes a plurality of power capacitors and an input/output plug on the first peripheral region, wherein each of the plurality of first bonding pads is electrically connected to a respective one of the plurality of power capacitors and the input/output plug on the first peripheral region.

14. The semiconductor memory device of claim 12, wherein the cell array structure further includes:

a stack structure including a plurality of word lines and a plurality of interlayer dielectric patterns that are alternately stacked;

a plurality of semiconductor patterns that are stacked and cross the plurality of word lines;

a bit line that crosses the plurality of word lines and contacts first lateral surfaces of the plurality of semiconductor patterns; and a plurality of data storage elements contacting second lateral surfaces of the plurality of semiconductor patterns, respectively.

15. The semiconductor memory device of claim 14, wherein the cell array region of the cell array structure includes a bit-line connection region and a word-line connection region, wherein the plurality of first bonding pads include:

a plurality of first upper bonding pads electrically connected to a plurality of bit lines, respectively, on the bit-line connection region; and a plurality of second upper bonding pads electrically connected to the plurality of word lines, respectively, on the word-line connection region.

16. The semiconductor memory device of claim 15, wherein the peripheral circuit structure includes:

a first core region that overlaps the bit-line connection region and includes a plurality of sense amplifiers; and a second core region that overlaps the word-line connection region and includes a plurality of sub-word line drivers.

17. The semiconductor memory device of claim 12, wherein the peripheral circuit structure includes:

a core region that overlaps the cell array region and includes a plurality of sense amplifiers and a plurality of sub-word line drivers; and a second peripheral region that overlaps the first peripheral region.

18. A semiconductor memory device, comprising:

a cell array structure including a plurality of first bonding pads electrically connected to a plurality of memory cells, respectively, the cell array structure including a cell array region on which the plurality of memory cells are provided and a first peripheral region adjacent the cell array region, the cell array region including a bit-line connection region and a word-line connection region; and a peripheral circuit structure including a plurality of peripheral circuits and a plurality of second bonding pads that are electrically connected to the plurality of peripheral circuits, respectively, and are bonded to the plurality of first bonding pads, respectively, wherein the cell array structure includes:

a lower dielectric layer including a first surface and a second surface that are opposite to each other;

a stack structure including a plurality of word lines that are stacked in a direction perpendicular to the first surface of the lower dielectric layer;

a vertical structure including a plurality of bit lines in the stack structure;

an input/output plug in a dielectric layer on the stack structure;

an input/output pad on the second surface of the lower dielectric layer on the first peripheral region, the input/output pad being electrically connected to the input/output plug; and a plurality of dummy pads on the second surface of the lower dielectric layer on the bit-line connection region and the word-line connection region.

19. The semiconductor memory device of claim 18, wherein the cell array structure further includes:

a plurality of semiconductor patterns that cross the plurality of word lines and are stacked in the direction perpendicular to the first surface of the lower dielectric layer; and a plurality of data storage elements in contact with first lateral surfaces of the plurality of semiconductor patterns, respectively.

20. The semiconductor memory device of claim 18, wherein the peripheral circuit structure includes:

a first core region that overlaps the bit-line connection region and includes a plurality of sense amplifiers; and a second core region that overlaps the word-line connection region and includes a plurality of sub-word line drivers.

* * * * *